United States Patent
Wong et al.

(10) Patent No.: US 12,085,599 B2
(45) Date of Patent: Sep. 10, 2024

(54) METHODS AND SYSTEMS FOR DETECTION, LOCATION AND CHARACTERIZATION OF SIGNAL SOURCES IN ELECTRICAL INFRASTRUCTURE USING DISTRIBUTED SENSORS

(71) Applicant: DX TECH PTY LTD, Prahran (AU)

(72) Inventors: Khoi Loon Wong, Prahran (AU); Anthony Marxsen, Black Rock (AU); Mu Liang, Wheelers Hill (AU)

(73) Assignee: DX TECH PTY LTD, Prahran (AU)

( * ) Notice: Subject to any disclaimer, the term of this patent is extended or adjusted under 35 U.S.C. 154(b) by 63 days.

(21) Appl. No.: 17/785,834

(22) PCT Filed: Feb. 5, 2021

(86) PCT No.: PCT/IB2021/050963
§ 371 (c)(1),
(2) Date: Jun. 15, 2022

(87) PCT Pub. No.: WO2021/156821
PCT Pub. Date: Aug. 12, 2021

(65) Prior Publication Data
US 2023/0058617 A1    Feb. 23, 2023

Related U.S. Application Data

(60) Provisional application No. 62/971,296, filed on Feb. 7, 2020.

(51) Int. Cl.
*G01R 31/08* (2020.01)
(52) U.S. Cl.
CPC ................... *G01R 31/085* (2013.01)

(58) Field of Classification Search
CPC .... G01R 31/085; G01R 31/086; G01R 31/08; G01R 31/312
(Continued)

(56) References Cited

U.S. PATENT DOCUMENTS 6,477,475 B1  11/2002  Takaoka et al.
7,110,864 B2 *  9/2006  Restrepo .............. H02H 1/0015
                                                324/536
(Continued)

FOREIGN PATENT DOCUMENTS

AU    2006326931    12/2006
AU    2012357658    12/2012
(Continued)

OTHER PUBLICATIONS

Nashawati, "Dynamic System Reduction and Fault Location Identification Using Synchrophasors," The University of Texas at Arlington, Electrical Engineering, pp. 1-84 (2012).
(Continued)

*Primary Examiner* — Tung X Nguyen
*Assistant Examiner* — Robert P Alejnikov, Jr.
(74) *Attorney, Agent, or Firm* — DLA Piper LLP US

(57) ABSTRACT

A system for detecting an event in an electrical infrastructure is disclosed. The system includes a plurality of monitoring stations configured to monitor signals from electrical equipment to detect one or more events associated with the electrical equipment. The monitoring stations are spaced at intervals along the electrical infrastructure. The system further includes a processor configured to analyze the detected events to obtain information regarding at least one of location, character and severity of each event associated with the electrical equipment, and output the obtained information.

20 Claims, 9 Drawing Sheets

(58) Field of Classification Search
USPC .......................................................... 324/522
See application file for complete search history.

(56) References Cited

U.S. PATENT DOCUMENTS

| | | | |
|---|---|---|---|
| 9,588,169 B1* | 3/2017 | Watkins | G01R 31/58 |
| 9,606,164 B2* | 3/2017 | Wong | G01R 31/08 |
| 10,090,664 B2 | 10/2018 | Schweitzer, III et al. | |
| 10,310,005 B2 | 6/2019 | Schweitzer, III et al. | |
| 10,422,827 B2 | 9/2019 | Schweitzer, III et al. | |
| 2014/0077820 A1* | 3/2014 | Al-Ghannam | G01R 31/58 |
| | | | 324/522 |
| 2014/0354293 A1 | 12/2014 | Wong et al. | |
| 2016/0216310 A1 | 7/2016 | Schweitzer, III et al. | |
| 2017/0082675 A1* | 3/2017 | Schweitzer, III | H02H 1/0007 |
| 2017/0131343 A1 | 5/2017 | Schweitzer, III et al. | |
| 2017/0146585 A1* | 5/2017 | Wang | G01R 23/02 |
| 2018/0083437 A1 | 3/2018 | Schweitzer, III et al. | |
| 2018/0212421 A1 | 9/2018 | Schweitzer, III et al. | |
| 2018/0292448 A1 | 10/2018 | Schweitzer, III et al. | |
| 2021/0103006 A1 | 4/2021 | Menzel et al. | |
| 2021/0150877 A1 | 5/2021 | Menzel et al. | |
| 2023/0394950 A1 | 12/2023 | Menzel et al. | |

FOREIGN PATENT DOCUMENTS

| | | |
|---|---|---|
| EP | 1001271 A1 | 5/2000 |
| WO | 2016118584 A1 | 7/2016 |
| WO | WO-2017/049224 A1 | 3/2017 |
| WO | 2018010369 A1 | 1/2018 |
| WO | 2019195582 A1 | 10/2019 |

OTHER PUBLICATIONS

Written Opinion for International Application No. PCT/IB2021/050963, mailed Mar. 12, 2021.
International Search Report for International Application No. PCT/IB2021/050963, mailed Mar. 12, 2021.
Extended European Search issued in EP Application No. 21750767, 18 pages, dated Feb. 27, 2024.

* cited by examiner

METHODS AND SYSTEMS FOR DETECTION, LOCATION AND CHARACTERIZATION OF SIGNAL SOURCES IN ELECTRICAL INFRASTRUCTURE USING DISTRIBUTED SENSORS

CROSS REFERENCE TO RELATED APPLICATIONS

This application is a U.S. National Stage Application of International Application No. PCT/IB2021/050963, filed Feb. 5, 2021, which claims priority to U.S. Provisional Application No. 62/971,296 filed Feb. 7, 2020, the content of which are hereby incorporated by reference in their entireties.

Cross reference to related applications—This application is related to Australian patents AU2006326931 and AU2012357658, the contents of which are hereby incorporated by reference in their entirety.

FIELD

The present disclosure relates to detection, location and characterization of signal sources in electrical infrastructure using distributed sensors.

BACKGROUND

Electrical infrastructure such as conductor cables, insulators bushings and electrical terminations on outdoor power equipment deteriorate over time due to exposure to moisture, pollution, heat and UV radiation. Electrical infrastructure can also be compromised by encroachment of nearby vegetation and deposition of pollutants from the local environment. Known techniques for detecting deterioration, compromise and defects in electrical infrastructure are only useful in detecting large defects and require inspection, which involves labor time and cost.

It is an object of the present disclosure to overcome the problems associated with known techniques by providing systems and methods to detect deterioration, compromise and defects in electrical infrastructure early enough to allow them to be remedied before they cause safety risks, equipment damage, or loss of electrical supply.

BRIEF DESCRIPTION OF DRAWINGS

Other objects and advantages of the present disclosure will become apparent to those skilled in the art upon reading the following detailed description of exemplary embodiments, in conjunction with the accompanying drawings, in which like reference numerals have been used to designate like elements, and in which.

DETAILED DESCRIPTION

Figure 1:
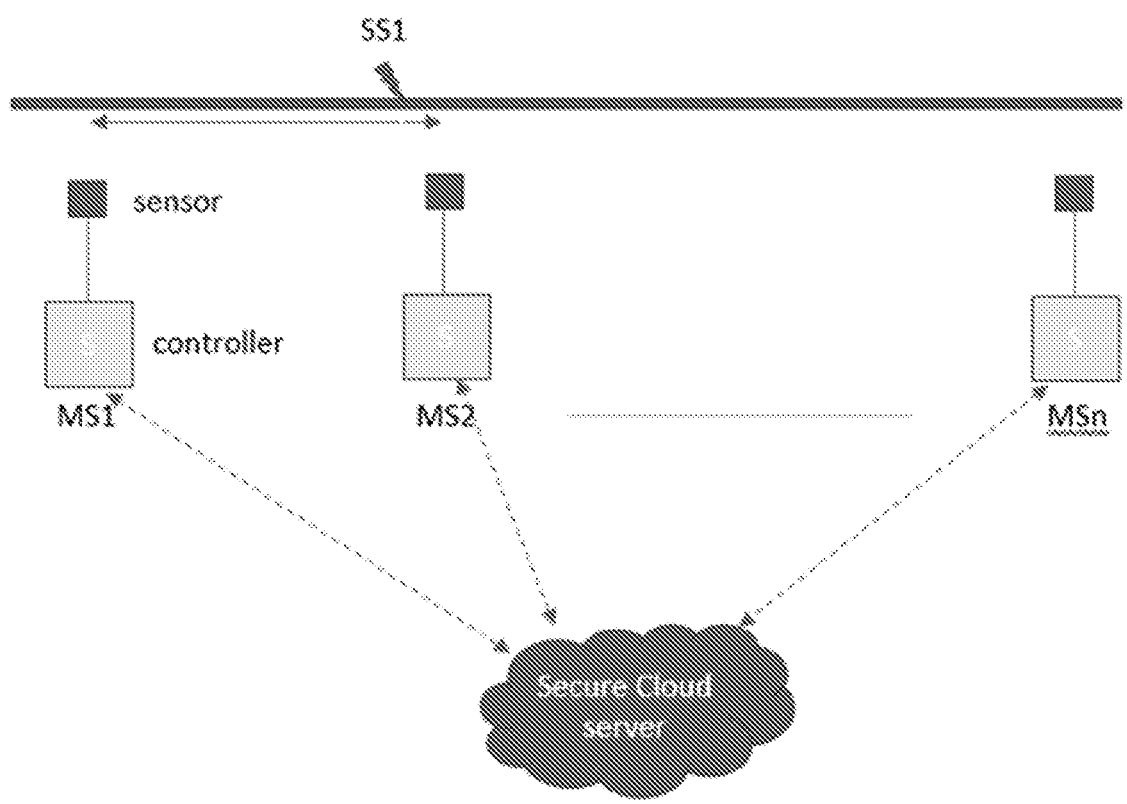
FIG. 1 illustrates an arrangement of signal source detection system according to an exemplary embodiment of the present disclosure.

The present disclosure provides techniques to detect deterioration, compromise, defects, and/or any other events in electrical infrastructure early enough to allow them to be remedied before they cause safety risks, equipment damage, or loss of electrical supply. As used herein, the term "electrical infrastructure" can include electricity supply networks, of all voltages whether AC or DC, at premises, neighborhood, city, regional and national scales. It can also include powerlines, substations, power stations, electric traction supply networks, electrical networks in vehicles such as cars, trucks, ships, trains and aircraft, in onshore and offshore industrial facilities, and in buildings. It may include all the items of electrical equipment that comprise these things.

Many instances of deterioration, compromise and defects in electrical equipment can emit signals which travel on the electric infrastructure in which the equipment is embedded. Monitoring stations spaced at intervals along the infrastructure's conducting paths can detect these signals. Analysis of the detected signals can provide information on the location, character and severity (risk level) of each instance to allow the infrastructure owner to remedy them before they develop into network faults that can cause electricity supply interruptions, fires or other damage or safety risk to line workers or the public. Signals can include electrical disturbances, whether in voltage or current, of any frequency, intermittent or constant, that are carried on or by electrical infrastructure or radiated from it in the form of electromagnetic fields.

Monitoring stations can include sensors, either capacitive coupling devices near unscreened conductors or current transformers on screened cables, or any other sensor capable of monitoring voltage, current or electromagnetic field disturbances near the monitored conductor, plus dedicated digital controllers that perform analogue-to-digital conversion, processing of the sensor's digital data-stream and communications with a remote server. Sensors can include capacitive coupling devices and current transformers and other devices, whether stationary or mobile, capable of measuring signals.

Each monitoring station can be configured to calculate and records key signal parameters and the time of the signal's arrival at the monitoring station's location. It can then transmit this data to a remote server for further processing in combination with data from other monitoring stations.

Signal sources can include all processes and situations on or in electrical infrastructure that generate signals. The location of each signal source can be determined using a time-of-flight algorithm running on the remote server. This algorithm may use the recorded signal arrival times sent by multiple monitoring stations. Time-synchronization across monitoring stations can ensure the signal arrival times are consistently measured against a common clock. Time-synchronization can be provided by the GPS satellite network if the monitoring stations are geographically dispersed or by direct communications between monitoring stations if they are close together.

FIG. 1 shows an exemplary arrangement of a signal source detection system such that the detection, location and characterization of signal sources in the system allow remedial action to be taken to prevent the associated equipment deterioration, compromise or defects from developing into more serious faults that create risks to public and workforce safety and the reliability of electricity supply.

For instance, signals from signal source SS1 travel past monitoring stations MS1 and MS2. Due to SS1's closer proximity to MS2, signals arrive at MS2 before they arrive at MS1. The location of SS1 can be calculated from the difference in the times of the signal's arrival at MS1 and MS2 using the speed of travel of the signals. In this way, each pair of monitoring stations defines a monitored path across the electrical infrastructure.

Detection can enable identification and recording of signals emitted by a signal source and can include the differentiation of such signals from background noise in the system and from extraneous or irrelevant signals such as lightning, nearby radio stations, farm machinery, etc. Location of a signal source in space can be on a map or drawing or other representation of the monitored electrical infrastructure to any level of accuracy. Characterization of signal source can be based on calculation and recording of key signal parameters that are different for different types of signal source to enable signal sources to be compared and distinguished from each other, whether located close together or widely separated.

Figure 2:
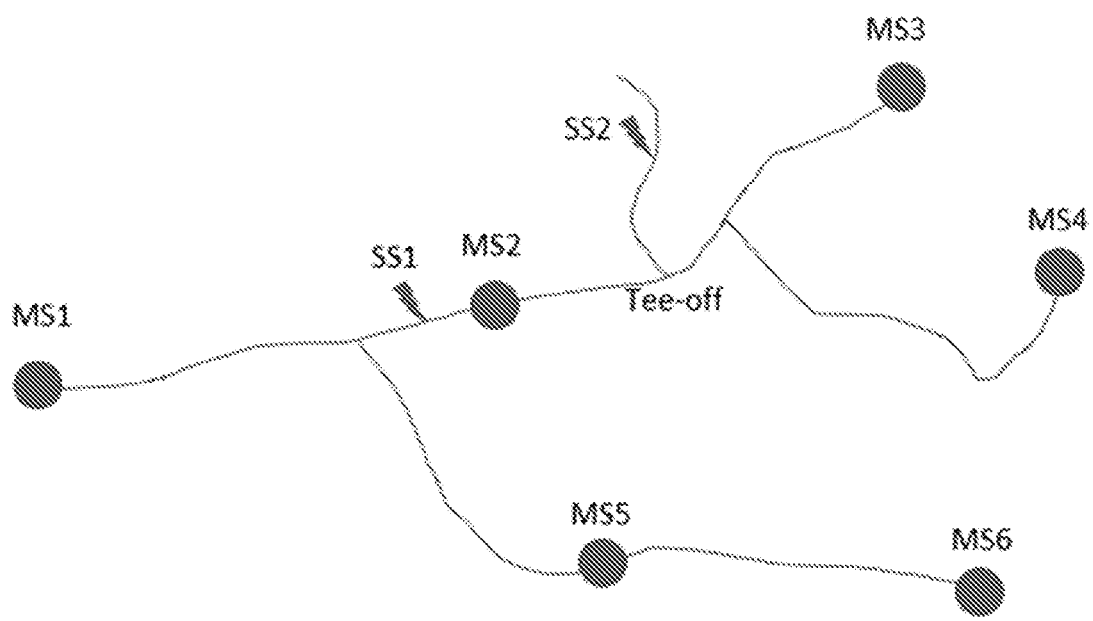
FIG. 2 shows an electrical infrastructure with multiple monitoring stations and signal sources according to an exemplary embodiment of the present disclosure.

FIG. 2 shows an exemplary electrical infrastructure with multiple monitoring stations and signal sources where multiple monitoring station pairs are defined by creating overlapping monitored paths. This can improve the reliability of detection. Signal source SS1 can be detected and located by monitoring station pairs MS1-MS2, MS2-MS5, MS1-MS3, MS1-MS4. A strong signal source can be detected and located on multiple paths defined by multiple monitoring station pairs. For signal sources located off the monitored paths, the location algorithm can identify the tee-off point as the source location. For example, signals from source SS2 travel to the tee-off point and on to the monitoring stations on the network. The location algorithm can identify the tee-off point as the location of SS2.

Figure 3:
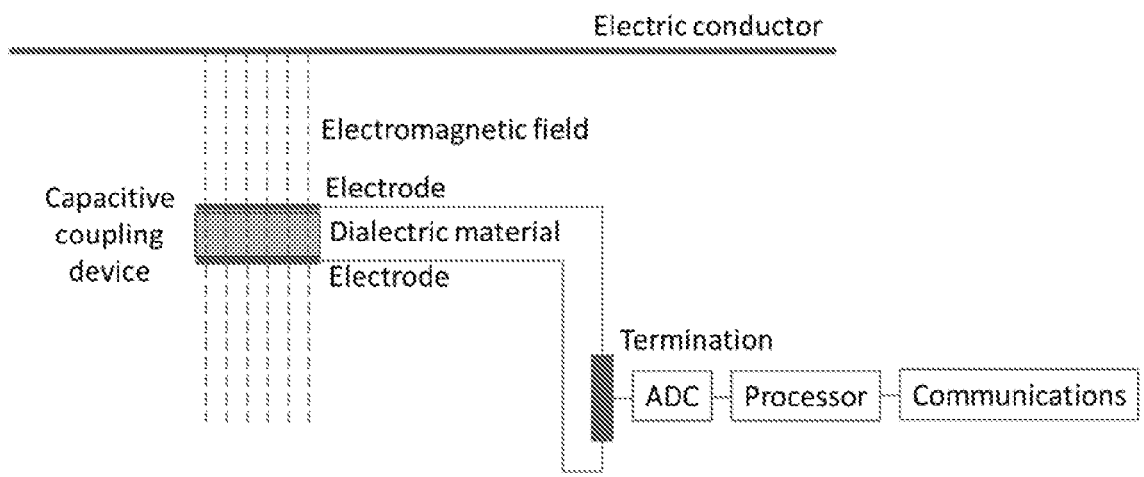
FIG. 3 shows a capacitive coupling device used as sensor according to an exemplary embodiment of the present disclosure.

FIG. 3 shows an exemplary capacitive coupling device used as sensor. The capacitive coupling sensor can measure signals travelling on or radiated by the conductor. The capacitive coupling sensor can measure the potential difference between two separated electrodes using a terminating electrical impedance (termination). Each electrode can be a conducting surface or a wire or a metallic object of another shape or form. The dielectric material between the electrodes can be air or other dielectric material. The electrode furthest from the monitored conductor(s) may be connected to earth to manage voltage levels in the associated circuitry.

The potential difference measured across the termination can be proportional to the electric component of the electromagnetic field at the location of the capacitive coupling sensor which in turn can be proportional to the voltage on the adjacent monitored conductor with respect to earth or other nearby conductors. The nominal voltage on the monitored conductor can range from zero to over 500,000 volts. The frequency of the potential difference across the termination measures the number of directional changes of the electromagnetic field per unit of time. The frequency of the potential difference across the termination can range from power frequency (about 50/60 Hz) to 3 GHz.

Figure 4:
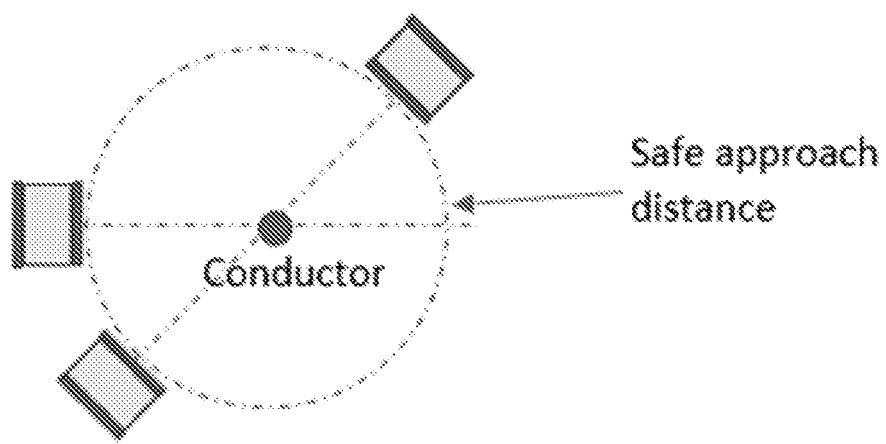
FIG. 4 shows a capacitive coupling device in relation to monitored electrical conductor according to an exemplary embodiment of the present disclosure.

FIG. 4 shows an exemplary capacitive coupling device in relation to monitored electrical conductor. The capacitive coupling device can be mounted perpendicular to the monitored conductor at any angle so long as it remains outside the safe approach limit of the conductor. Being outside the safe approach limit allows the capacitive coupling device to operate safely and be installed without special safety procedures.

Figure 5:
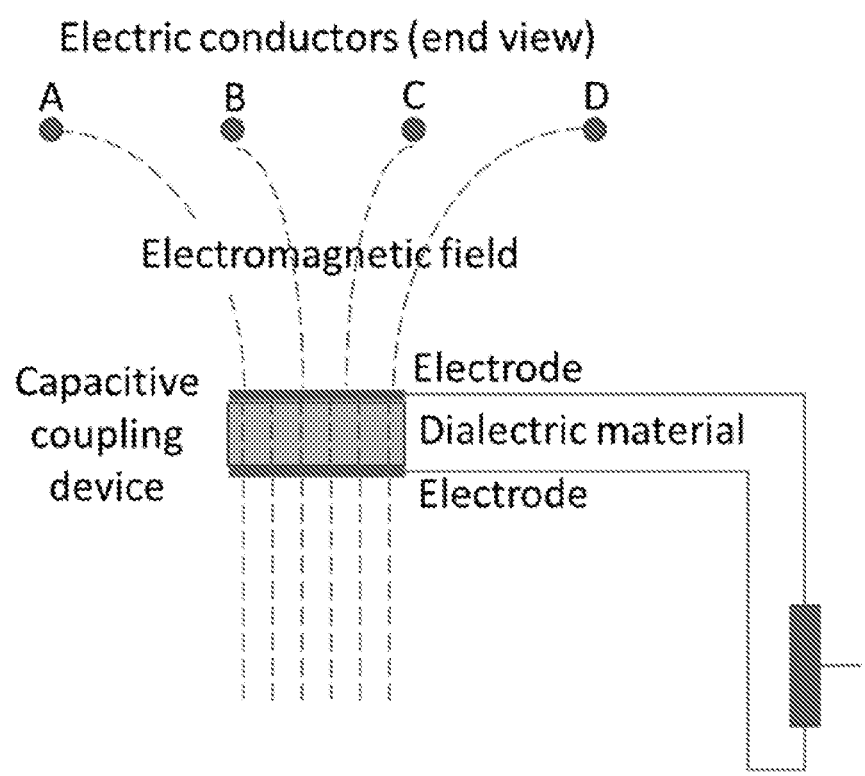
FIG. 5 shows monitoring of multiple electric conductors by capacitive coupling device according to an exemplary embodiment of the present disclosure.

FIG. 5 shows an exemplary monitoring of multiple electric conductors by a capacitive coupling device, which can be used to measure the combined field produced by more than one conductor. In this configuration, the device is still able to detect signals on the electrical infrastructure but may be unable to determine from which specific conductor or conductors the signals originate. Additionally, the capacitive coupling device for electrical infrastructure monitoring can operate safely because it is non-contact and it would function effectively when mounted outside the mandated safe-approach limits around high-voltage conductors.

The capacitive coupling device for electrical infrastructure monitoring can have the ability to detect all sources of high-frequency signals, including partial discharge, micro-arcing, surface tracking, creeping discharge, failing joints, etc. Such a device can have low cost and simplicity; and have a versatility of application (can be mounted at any angle, can cover any number of conductors, and work at any voltage level) to suit the widest possible range of applications.

Figure 6:
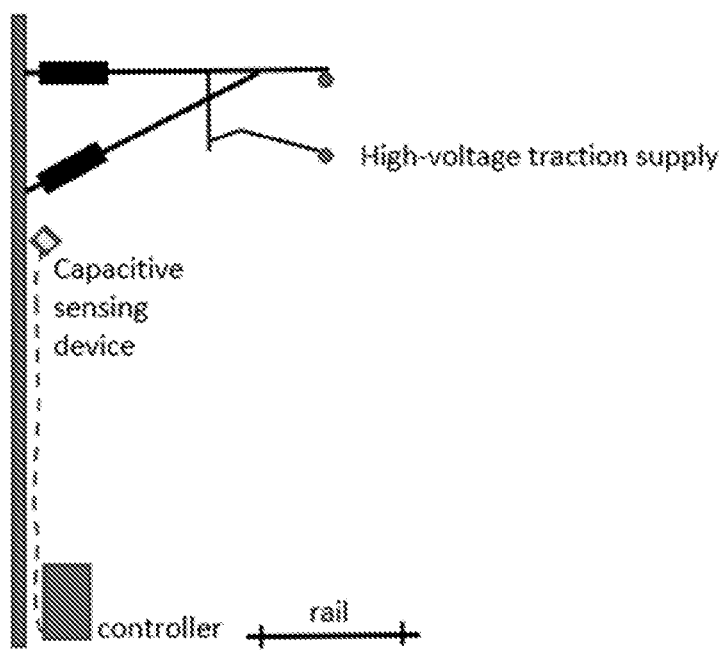
FIG. 6 shows a capacitive coupling device monitoring overhead traction supply on electric rail system according to an exemplary embodiment of the present disclosure.

FIG. 6 shows an exemplary application of the presently disclosed capacitive coupling device to monitor overhead traction supply on electric rail system. Electric trains and trams are often supplied by a high-voltage overhead conductor supported by masts along the train track. The train obtains its power via a pantograph-mounted collector which slides on this conductor. The current collected from the conductor passes through the traction motor and returns to the source via the rails on which the train runs. A capacitive coupling device can be installed on a mast with the top electrode directed towards the high-voltage metal components supporting the overhead conductor.

Deterioration, compromise and defects on the overhead wires, insulators, cables and other equipment generate signals and these signals can travel past and be measured by the capacitive coupling device and recorded by the controller. A faulty pantograph and poor pantograph alignment or pantograph bounce can create arcing due to a bad sliding contact. This arcing constitutes a defect which can create signals measured by remote capacitive coupling devices. Using the time-of-flight algorithm, the locations of all such defects can be determined with two or more capacitive coupling devices installed along the track.

In an exemplary embodiment, the presently disclosed capacitive coupling device can be used in 'third-rail' electric traction supply systems that draw high-voltage electric supply from a moving contact on a third rail located between or in the vicinity of the two conventional rails on which the trains run. Capacitive coupling devices mounted to face the third rail from a safe distance can measure signals generated by defects, compromise and deterioration in the high-voltage traction supply infrastructure. Measurements from pairs of monitoring stations can locate the defect that is generating the signals. Moving sources of signals created by defective moving contacts on the third rail can also be tracked to identify problems with moving contacts.

In an exemplary embodiment, the presently disclosed capacitive coupling device sensors can also be applied to monitor low-voltage wiring. For example, at voltage levels of 115 volts or less sensors can easily be connected to wires or capacitively coupled to them. This greatly reduces costs and effort as specialist high-voltage electrical workers are not required for sensor installation—simply plugging a suitably-designed sensor into a power outlet may suffice, or the sensor could be built into the electricity meter or other standard item of low-voltage equipment at the premises.

With this arrangement, signal sources can be detected and located on the whole electricity supply infrastructure in the normal way. However, a level of ambiguity may be introduced into the identification of the phase (wire) the defect is on. This ambiguity can be reduced by consideration of the configuration of the supply transformer used to reduce the voltage to normal premises wiring levels.

In an exemplary embodiment, the presently disclosed capacitive coupling device can be used in conjunction with current transformers in mixed overhead and underground cables. Each monitored path through the electrical infrastructure may include a variety of conductors: overhead powerlines, underground cables, open bus-work in substation yards and switchboards. The accuracy of location of detected signal sources can be preserved by varying the speed of travel used in the time-of-flight location algorithm to match the variation that applies in the physical reality of the infrastructure.

One way to do this is to use an equivalent length that considers the speed of signal travel. The location algorithm would then use segment lengths that differ from actual lengths. For example, a one-kilometer segment of underground cable can be included in a five-kilometer length of overhead powerline and the location algorithm would perform its calculation assuming the cable is 1,500 meters long if the speed of travel in the cable is two-thirds of the speed on the overhead sections. When the location is calculated it can be translated back to physical reality using the inverse of this approach.

For mixed infrastructure where one of the ends of the monitored path is a different type of construction to the other, e.g. one overhead powerline and the other underground cable, the two sensors can be of different types: capacitive coupling device for the overhead and current transformer for the underground cable. The location algorithm remains essentially unaltered.

In an exemplary embodiment, the presently disclosed capacitive coupling device can be used for auto-phasing of multiphase networks. Electricity supply networks include powerlines, busbars and cables that can comprise multiple conductors identified as different phases of the electric supply. For example, many powerlines comprise three wires labelled Red/White/Blue, A/B/C, R,S,T, or 1/2/3 depending on the country in which they are located. Each of the three wires is a separate phase and can be connected only to equipment connected to that phase across the entire extent of the infrastructure.

Detection, location and characterization of signal sources on electrical infrastructure provides maximum value when signal data from the same phase can be correlated across multiple sensors. For example, correlated signals measured on Red phase at multiple sensor locations may indicate a defect on a Red phase wire or a failing item of equipment connected to Red phase. This identification helps repair crews find the defect at the location of the detected signal source.

Identification of a particular phase at multiple sensor locations can be done using the monitoring stations and associated sensors. This avoids costly manual processes using expensive field-test equipment. The method for identification is as follows. Each monitoring station can measure and record the phase angle of the mains-frequency signal from each sensor connected to it, using the common clock as a reference. It can then transmit this phase angle data to the remote server. The phase angle of the voltage on each phase should be similar across all locations on the network. A program running on the server can group the phase angle records into bands or ranges that show which particular sensors are measuring signals from each individual phase conductor across the whole monitored infrastructure.

The sensor phase identifications for any conveniently located sensor can be related by visual inspected to the phasing of electrical infrastructure beyond the monitored network. Once this is done, the different phases are identified at all monitoring station locations.

A person of ordinary skilled in the art would appreciate that the applications previously described in the present disclosure are illustrative but non-limiting. Various exemplary non-limiting embodiments can include applications such as load-balancing of multiphase networks, integrated weather station, etc.

In an exemplary embodiment, the present disclosure provides aspects related to signal source location error correction. The high-frequency signals produced by defects in electric infrastructure assets comprise short-duration packets characterized by multiple peaks in the signal level with the largest peaks occurring towards the start of the packet. The time of measurement of the largest peak in the signal packet can be taken as an approximate measure of the time of arrival of the packet. Using this measure of arrival time, the location of a signal source is calculated from the arrival times of signal packet at multiple monitoring stations.

For example, as shown in FIG. 2, a signal packet emanating from a signal source arrives at monitoring station 1 (MS1) at time $t_1$ and a signal packet from the same source arrives at monitoring station 2 (MS2) at time $t_2$. The distance between MS1 and MS2 is/and the speed of travel of the signal is c. The distance D between the signal source and MS1 can be calculated using the following formula:

$$D = \frac{l - c(t_2 - t_1)}{2}$$

The accuracy of location of signal source is determined by the accuracy of measurement of times $t_1$ and $t_2$ using a common clock. To provide a common clock, the geographically dispersed monitoring stations are time-synchronized using the GPS satellite network which provides all monitoring stations with a common Pulse Per Second (PPS) signal and the date/time stamp for that signal. All monitoring stations start sampling the signal at the same time when they receive the PPS trigger signal from the GPS satellite network. If monitoring stations are close enough to each other, a direct communications link between them can be used to establish a common PPS trigger.

When the highest-magnitude peak in a signal packet is detected by a monitoring station, the arrival time of this peak can be recorded and transmitted to a central processing facility. The location of the signal source that produced the signal packet can then be determined by the measured times of signal peaks at pairs of monitoring stations as previously described.

The measured time of arrival of the signal packet can be the number of sampling intervals between the start of sampling (the PPS trigger) and the sample that contains the highest-magnitude peak (the sample with the largest magnitude). This number of samples can be multiplied by the sampling interval and added to the GPS time of the PPS trigger at the start of the sampling process (obtained from the GPS date/time stamp).

The sampling rate and therefore the sampling interval can be set by the Analogue-to-Digital Converter (ADC) clock frequency. Differences between ADC clock frequencies in different monitoring stations can cause the sampling interval to vary from one monitoring station to another which may introduce errors into the measurement of ($t_2-t_1$) and hence corresponding errors in the calculated location of the signal source.

To offset the error caused by differences in ADC clock frequency, the number of samples between successive PPS triggers can be recorded by each monitoring station and passed to the central facility where the location of signal sources is calculated. This data can then be used to correct the error caused by differences in ADC clock frequency in different monitoring stations.

For instance, the designed nominal ADC clock frequency is $f_s$ and the recorded count of samples between successive PPS triggers (i.e. over a one-second interval) is $f_a$ and the measured arrival time of the signal peak (the number of samples before the detected signal peak multiplied by the nominal sample interval) is $t_m$. The actual (corrected) arrival time of the signal peak $t_a$ at each monitoring stations is then calculated using the following formula:

$$t_a = \frac{f_s}{f_a} t_m$$

This arrival time for the signal peak can then be used in the signal source location calculation.

A significant feature of this error correction system is that the correction can be done centrally in post-processing at any convenient time after the signal measurements are captured, using only a single additional item of data (the count of samples between consecutive PPS triggers) collected by each monitoring station at the time of signal measurement.

This can enable simple, low-cost, low-power hardware to be used in the monitoring stations, greatly reducing overall system costs. It can increase the accuracy of location of electrical infrastructure problems (signal sources) dispersed across wide geographic areas to levels previously only available in laboratory situations using high-cost equipment fitted with for example, oven-stabilized crystal oscillators as ADC clocks.

The local ADC clock can be adjusted in remote data processing at a later time, thereby avoiding the complexity and cost of additional high-cost circuitry in the monitoring units with higher power drain and all the challenges that higher power drain can bring with solar-powered equipment.

In an exemplary embodiment, the present disclosure provides aspects related to comparative risk score for electrical assets. The risk score can be a single number that indicates the comparative risk of a fault occurring at a location on a physical segment of electrical infrastructure. A segment can be a physical length of monitored electrical infrastructure that may include a diversity of electrical assets.

Non-limiting examples of segments include: a specific length of powerline comprising conductors, poles, transformers, switches, etc.; or, a specific length of high-voltage bus-work in a switchboard comprising multiple high voltage switches, cable terminations, etc.; or a specific path of underground cables with kiosk substations or other connected assets distributed along its length, such as could be found in a large housing estate supplied by underground reticulation, etc.

The risk score can be calculated, either at regular intervals or as required, using historical data on detections of signal sources with calculated locations that fall within the limits of the defined segment. It can be the sum of five components, each of which is normalized using the highest value for that component calculated across a defined population of other similar segments:

1) Detections during a short interval immediately preceding the calculation:

$$\text{Score } 1 = \frac{\text{Number of detections during the interval}}{\text{Highest number of detections}} \times 100$$

2) A measure of detection magnitude during the interval:

$$\text{Score } 2 = \frac{N^{th} \text{ centile of detection magnitude during the interval}}{\text{Highest } N^{th} \text{ centile of detection magnitude}} \times 100$$

3) Detections short-term trend:

$$\text{Score } 3 = \frac{\text{Short term trend of the number of detections}}{\text{Highest short term trend}} \times 100$$

4) Detections medium-term trend:

$$\text{Score } 4 = \frac{\text{Medium term trend of the number of detections}}{\text{Highest medium term trend}} \times 100$$

5) Detections long-term trend:

$$\text{Score } 5 = \frac{\text{Long term trend of the number of detections}}{\text{Highest long term trend}} \times 100$$

The population of segments used to create a comparative measure can be any population of segments having some common attribute that makes the comparative risk score meaningful for the user of the information. Examples include: all monitored segments belonging to infrastructure owned by a single party; all monitored segments located in a particular region; all monitored segments containing instances of a particular equipment type; etc.

The periods chosen for short-, medium- and long-term trend calculations can vary to suit each application. For electrical distribution networks, the nominal periods can be about 28 days, three months, and twelve months but these can change in the light of experience in a particular application.

The detection magnitude in score 2, as previously described, can be either the value of the measured signal peak in a detection or the calculated captured signal energy in a detection or another measure of magnitude of each individual detection of a signal source in the segment. The value of N in calculation of the centile measure of detection magnitude can be chosen to eliminate outliers caused by relatively rarer events such as lightning strikes and high-voltage switching operations that do not represent risk. In some cases, the value of N can be 95.

The risk score of each segment of monitored infrastructure can be a single number equal to the sum of the five component scores with a range from zero (no comparative risk) to 500 (very high comparative risk). That is, risk score=score 1+ score 2+ score 3+ score 4+ score 5.

Figure 7:
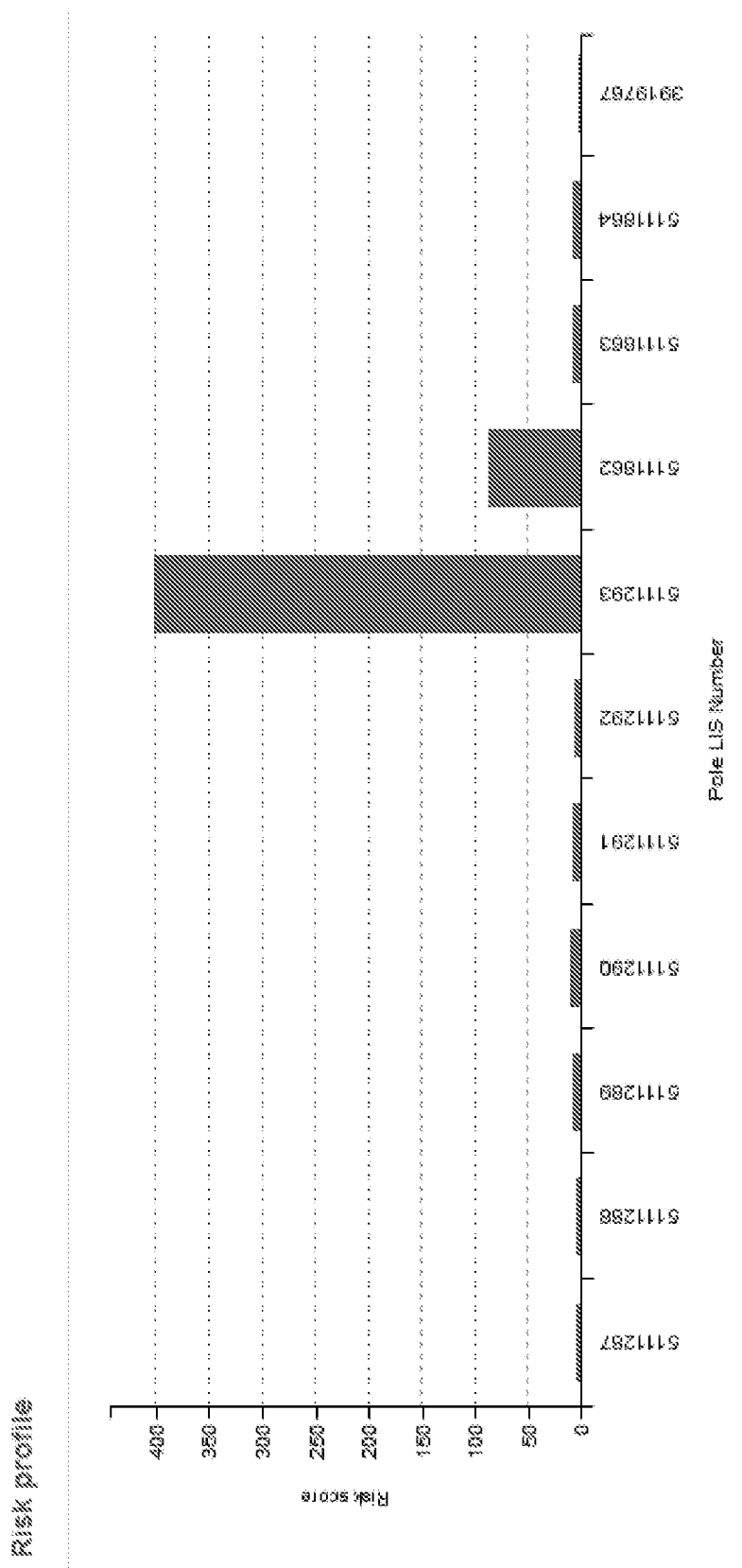
FIG. 7 shows a risk score plotted as a bar chart to produce a risk profile showing comparative risk for each segment of infrastructure according to an exemplary embodiment of the present disclosure.

FIG. 7 shows an exemplary risk score plotted as a bar chart to produce a risk profile showing comparative risk for each segment of infrastructure. As shown, the risk score varies along the length of a powerline with the score being the highest at pole number 5111293 and second highest at pole number 5111862. Other types of charts can be used for this purpose.

Figure 8:
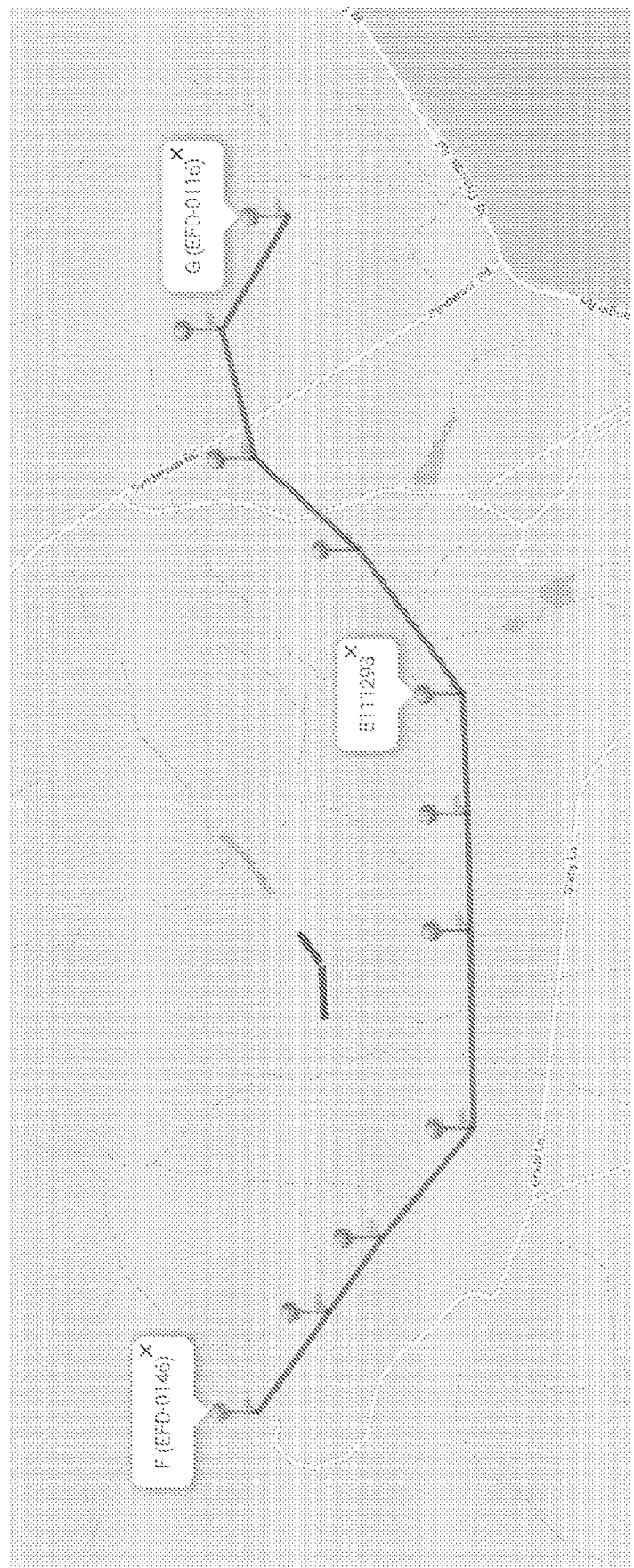
FIG. 8 shows a risk score as a heat map overlaid on a map of the monitored infrastructure according to an exemplary embodiment of the present disclosure.

FIG. 8 shows an exemplary risk score as a heat map overlaid on a map of the monitored infrastructure. The map of the monitored infrastructure can include various electric equipment, including the pole number 5111293.

Significant features of the presently disclosed risk score can include its efficiency in simple communication of comparative risk (reducing multiple complex charts and tables to a single number); and its alignment with infrastructure owners' traditional asset management and operational practices.

Aspects of the present disclosure provide signal source characterization described in detail as follows. For detected signal peaks, a segment of the sampled signal of length (T1+T1) is stored. For a signal segment with K sample and $s_i(t_i)$ is the sample stored, the $T^2$ and $W^2$ parameters are calculated using the equations:

$$\frac{\sum_{i=0}^{K} t_i \cdot s_i(t_i)^2}{\sum_{i=0}^{K} s_i(t_i)^2}$$

$$T^2 = \frac{\sum_{i=0}^{K} (t_i - t_0) \cdot s_i(t_i)^2}{\sum_{i=0}^{K} s_i(t_i)^2}$$

$$W^2 = \frac{\sum_{i=0}^{K} f_i^2 \cdot |X_i(f_i)|^2}{\sum_{i=0}^{K} |X_i(f_i)|^2}$$

where $X_i(f_i)$ defines as the frequency components of the signal segment

The $T^2/W^2$ parameters can be calculated for sections of signal waveform surrounding the signal peak and transmitted to the remote server. They can be plotted on an FT Chart that shows patterns that reveal similarities and differences between sources. As experience is gained these patterns can be correlated with site inspection results to identify the cause of the signal, e.g. a short circuit in a transformer winding, a vegetation touch, a broken conductor strand.

A person of ordinary skill in the art would appreciate that aspects of the present disclosure can be used for detection energy and detection count, which can include calculation of detection energy, charting of energy profile along a monitored infrastructure path, charting of detection count profile, similarly and interpretation of both. Aspects of the present disclosure can also be used for continuous and quasi-continuous signal sampling to facilitate fault location when infrastructure faults occur.

Aspects of the present disclosure provide filters for signal noise and signal convolution described in detail as follows. Electrical infrastructure carries many signals that are not relevant to identification of deterioration, compromise and defects. These can include signals from radio stations, customer appliances, etc. Taken together, these signals constitute background noise in the system. To maximize the reliability of detection of signal sources, this noise can be filtered out using a detection quality measure where detection quality equals number of peaks of equal magnitude in a given sampling period.

Perfect detection quality can have a value of one, i.e. there is only a single peak of that (highest) magnitude in the whole sampling period. A limit can be set on the value of detection quality so that only signal detections having up to a specific number of equal-highest magnitude peaks are included in location calculations. This can allow a trade-off between sensitivity and quality of signal source detection. This limit can be applied in the monitoring station to reduce dataflow volumes by eliminating data on detections that do not meet the detection quality standard. Alternatively, or in combination it can be applied in the remote server.

As signals travel on electrical infrastructure they can change due to convolution—a process whereby signal components of different frequency travel at different speeds and suffer different levels of attenuation. To overcome the effects of convolution, the polarity of the signal peak can be recorded, and location calculations ignore matches between peaks of opposite polarity from different sensors. This feature can be turned on or off to explore the character of the signal source.

A person of ordinary skill in the art would appreciate that aspects of the present disclosure can be used for identification and filtering of rain-caused signals. This can include heavy rain which can swamp other signal sources and distort risk scores, identification of location bursts, identification of rate bursts, categorization of detections, elimination of rain detections from charts and risk scores.

Aspects of the present disclosure can also be used for signal burst detection to determine whether there is a signal burst emanating from a location. Two main factors can be used to validate the signal burst: (1) The signal source detection counts n for each segment along the monitored path in the past t seconds. (2) The variance $s^2$ of the signal source detections' locations in the same period t. The value n can indicate the potential seriousness of the burst. The value $s^2$ can indicate the location concentration of the burst, a lower value means higher concentration. The values of potential seriousness and concentration can be used to trigger alerts to infrastructure operators.

Figure 9:
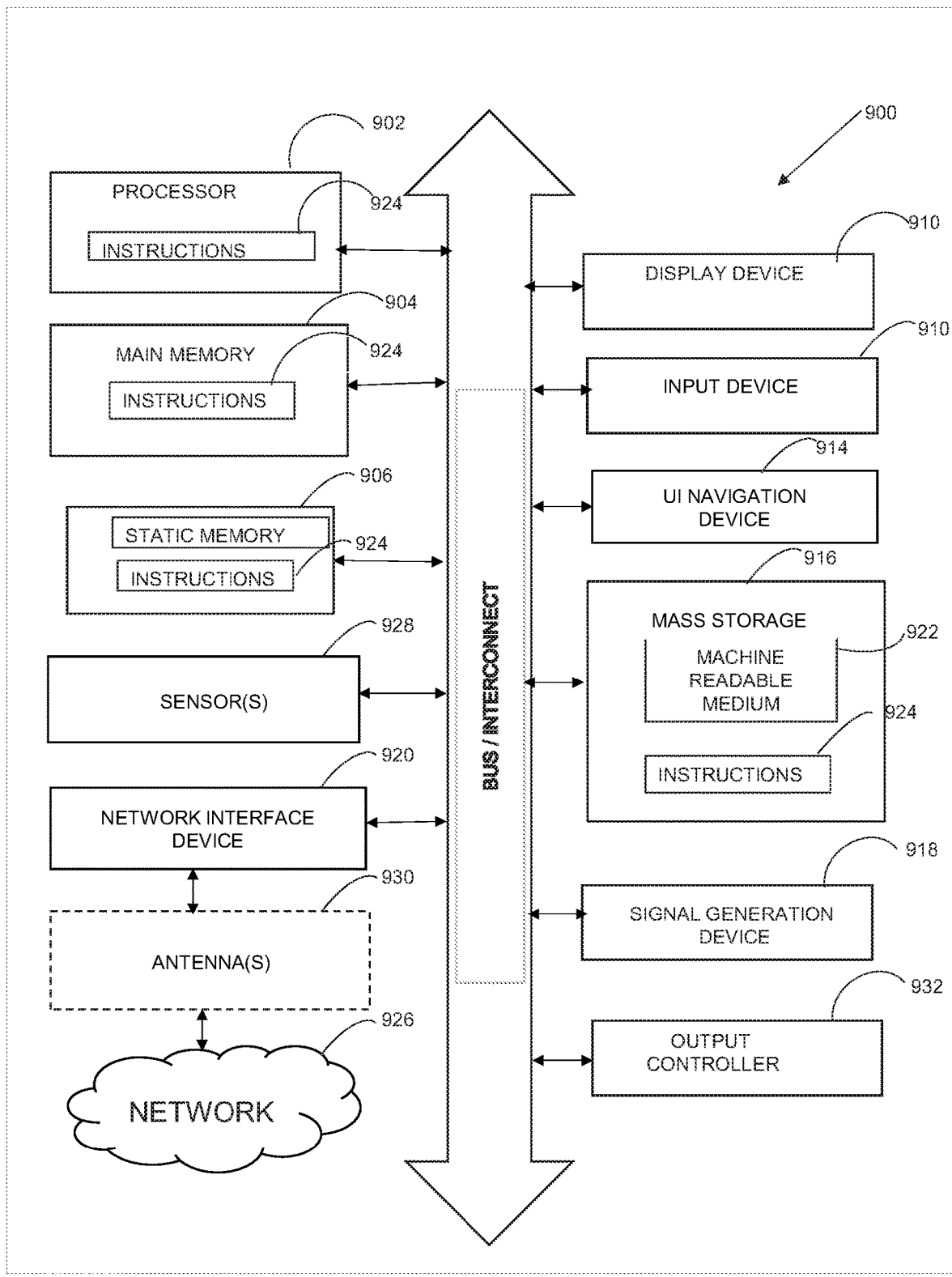
FIG. 9 illustrates an example of a machine configured to perform computing operations according to an embodiment of the present disclosure.

FIG. 9 is a block diagram illustrating an example computing system 900 upon which any one or more of the methodologies herein discussed may be run according to an example described herein. Computer system 900 may be embodied as a computing device, providing operations of the components featured in the various figures of the present disclosure, including any processing or computing platform or component described or referred to herein. In alternative embodiments, the computing system 900 can operate as a standalone device or may be connected (e.g., networked) to other devices. In a networked deployment, the computing system 900 may operate in the capacity of either a server or a client machine in server-client network environments, or it may act as a peer machine in peer-to-peer (or distributed) network environments.

Example computing system 900 can includes a processor 902 (e.g., a central processing unit (CPU), a graphics processing unit (GPU) or both), a main memory 904 and a static memory 906, which communicate with each other via an interconnect 908 (e.g., a link, a bus, etc.). The computer system 900 may further include a video display unit 910, an alphanumeric input device 912 (e.g., a keyboard), and a user interface (UI) navigation device 914 (e.g., a mouse). In one embodiment, the video display unit 910, input device 912 and UI navigation device 914 are a touch screen display. The computer system 900 may additionally include a storage device 916 (e.g., a drive unit), a signal generation device 918 (e.g., a speaker), an output controller 932, and a network interface device 920 (which may include or operably communicate with one or more antennas 930, transceivers, or other wireless communications hardware), and one or more sensors 928.

The storage device 916 can include a machine-readable medium 922 on which is stored one or more sets of data structures and instructions 924 (e.g., software) embodying or utilized by any one or more of the methodologies or functions described herein. The instructions 924 may also reside, completely or at least partially, within the main memory 904, static memory 906, and/or within the processor 902 during execution thereof by the computer system 900, with the main memory 904, static memory 906, and the processor 902 constituting machine-readable media.

While the machine-readable medium 922 is illustrated in an example embodiment to be a single medium, the term "machine-readable medium" may include a single medium or multiple medium (e.g., a centralized or distributed database, and/or associated caches and servers) that store the one or more instructions 924. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, optical media, and magnetic media. Specific examples of machine-readable media include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magneto-optical disks; and CD-ROM and DVD-ROM disks.

The instructions 924 may further be transmitted or received over a communications network 926 using a transmission medium via the network interface device 920 utilizing any one of several well-known transfer protocols (e.g., HTTP). Examples of communication networks include a local area network (LAN), wide area network (WAN), the Internet, mobile telephone networks, Plain Old Telephone (POTS) networks, and wireless data networks (e.g., Wi-Fi, 3G, 4G and 5G, LTE/LTE-A or WiMAX networks). The term "transmission medium" shall be taken to include any intangible medium that can store, encoding, or carrying instructions for execution by the machine, and includes digital or analog communications signals or other intangible medium to facilitate communication of such software.

Other applicable network configurations may be included within the scope of the presently described communication networks. Although examples were provided with reference to a local area wireless network configuration and a wide area Internet network connection, it will be understood that communications may also be facilitated using any number of personal area networks, LANs, and WANs, using any combination of wired or wireless transmission mediums.

The embodiments described above may be implemented in one or a combination of hardware, firmware, and software. For example, the features in the system architecture 900 of the processing system may be client-operated software or be embodied on a server running an operating system with software running thereon. While some embodiments described herein illustrate only a single machine or device, the terms "system", "machine", or "device" shall also be taken to include any collection of machines or devices that individually or jointly execute a set (or multiple sets) of instructions to perform any one or more of the methodologies discussed herein.

Examples, as described herein, may include, or may operate on, logic or several components, modules, features, or mechanisms. Such items are tangible entities (e.g., hardware) capable of performing specified operations and may be configured or arranged in a certain manner. In an example, circuits may be arranged (e.g., internally or with respect to external entities such as other circuits) in a specified manner as a module, component, or feature. In an example, the whole or part of one or more computer systems (e.g., a standalone, client or server computer system) or one or more hardware processors may be configured by firmware or software (e.g., instructions, an application portion, or an application) as an item that operates to perform specified operations. In an example, the software may reside on a machine readable medium. In an example, the software, when executed by underlying hardware, causes the hardware to perform the specified operations.

Accordingly, such modules, components, and features are understood to encompass a tangible entity, be that an entity that is physically constructed, specifically configured (e.g., hardwired), or temporarily (e.g., transitorily) configured (e.g., programmed) to operate in a specified manner or to perform part or all operations described herein. Considering examples in which modules, components, and features are temporarily configured, each of the items need not be instantiated at any one moment in time. For example, where the modules, components, and features comprise a general-purpose hardware processor configured using software, the general-purpose hardware processor may be configured as respective different items at different times. Software may accordingly configure a hardware processor, for example, to constitute a particular item at one instance of time and to constitute a different item at a different instance of time.

Additional examples of the presently described method, system, and device embodiments are suggested according to the structures and techniques described herein. Other non-limiting examples may be configured to operate separately or can be combined in any permutation or combination with any one or more of the other examples provided above or throughout the present disclosure.

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

The invention claimed is:

1. A system for detecting an event in an electrical infrastructure, the system comprising:
    a plurality of monitoring stations configured to monitor signals from electrical equipment to detect one or more events associated with the electrical equipment, wherein the monitoring stations are spaced at intervals along the electrical infrastructure; and
    a processor configured to analyze the detected events to obtain information regarding severity of each event associated with the electrical equipment, and output the obtained information, wherein obtaining the information regarding the severity of each event comprises analyzing historical data on signal source detections on a physical segment in which each event originates.

2. The system of claim 1, wherein the monitoring stations are configured to monitor the signals continuously.

3. The system of claim 1, wherein the events are visually unidentifiable.

4. The system of claim 1, wherein the monitoring stations include one or more monitoring station pairs that are defined by overlapping monitored paths.

5. The system of claim 1, wherein the monitoring stations include one or more sensors.

6. The system of claim 5, wherein the sensors are configured to monitor voltage, current or electromagnetic field disturbances.

7. The system of claim 5, wherein the sensors include at least one capacitive coupling device.

8. The system of claim 7, wherein the capacitive coupling device is configured to measure signals travelling on or radiated by a conductor.

9. The system of claim 1, wherein each monitoring station is configured to calculate and record key signal parameters and a time of the signal's arrival at a monitoring station's location.

10. The system of claim 1, wherein the processor is further configured to analyze the detected events to obtain information regarding a location, wherein the location is determined using a time-of-flight algorithm running at a remote server.

11. A computer-implemented method for detecting an event in an electrical infrastructure, the method comprising:
    monitoring, via a plurality of monitoring stations, signals from electrical equipment to detect one or more events associated with the electrical equipment, wherein the monitoring stations are spaced at intervals along the electrical infrastructure;
    analyzing, via a processor, the detected events to obtain information regarding severity of each event associated with the electrical equipment, wherein obtaining the information regarding the severity of each event comprises analyzing historical data on signal source detections on a physical segment in which each event originates; and
    outputting, via the processor, the obtained information.

12. The method of claim 11, wherein the monitoring stations are configured to monitor the signals continuously.

13. The method of claim 11, wherein the events are visually unidentifiable.

14. The method of claim 11, wherein the monitoring stations include one or more monitoring station pairs that are defined by overlapping monitored paths.

15. The method of claim 11, wherein the monitoring stations include one or more sensors.

16. The method of claim 15, wherein the sensors are configured to monitor voltage, current or electromagnetic field disturbances.

17. The method of claim 15, wherein the sensors include at least one capacitive coupling device.

18. The method of claim 17, wherein the capacitive coupling device is configured to measure signals travelling on or radiated by a conductor.

19. The method of claim 11, wherein each monitoring station is configured to calculate and record key signal parameters and a time of the signal's arrival at a monitoring station's location.

20. The method of claim 11 comprising analyzing, via the processor, the detected events to obtain information regarding a location, wherein the location is determined using a time-of-flight algorithm running at a remote server.

* * * * *